United States Patent
Kinyua et al.

(10) Patent No.: US 12,283,967 B2
(45) Date of Patent: *Apr. 22, 2025

(54) ANALOG TO DIGITAL CONVERTER WITH CURRENT STEERING STAGE

(71) Applicant: Taiwan Semiconductor Manufacturing Company, Ltd., Hsinchu (TW)

(72) Inventors: Martin Kinyua, Cedar Park, TX (US); Eric Soenen, Austin, TX (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/349,636

(22) Filed: Jul. 10, 2023

(65) Prior Publication Data

US 2024/0048148 A1 Feb. 8, 2024

Related U.S. Application Data

(63) Continuation of application No. 17/717,519, filed on Apr. 11, 2022, now Pat. No. 11,700,009, which is a
(Continued)

(51) Int. Cl.
*H03M 1/38* (2006.01)
*H03M 1/06* (2006.01)
(Continued)

(52) U.S. Cl.
CPC ......... *H03M 1/145* (2013.01); *H03M 1/0612* (2013.01); *H03M 1/164* (2013.01)

(58) Field of Classification Search
CPC .... H03M 1/44; H03M 1/0695; H03M 1/1215; H03M 1/164; H03M 1/167; H03M 1/144; H03M 1/145; H03M 1/42; H03M 1/468
(Continued)

(56) References Cited

U.S. PATENT DOCUMENTS

| | | |
|---|---|---|
| 4,641,129 A | 2/1987 | Doluca |
| 5,072,220 A | 12/1991 | Petschacher et al. |

(Continued)

FOREIGN PATENT DOCUMENTS

| | | |
|---|---|---|
| CN | 1512671 A | 7/2004 |
| CN | 100471069 C | 3/2009 |

(Continued)

OTHER PUBLICATIONS

Chinese Office Action for Application No. 201910249878.1 mailed Oct. 10, 2022.
(Continued)

*Primary Examiner* — Linh V Nguyen
(74) *Attorney, Agent, or Firm* — Merchant & Gould P.C.

(57) ABSTRACT

An analog-to-digital converter (ADC) includes a first ADC stage with a first sub-ADC stage configured to sample the analog input voltage in response to a first phase clock signal and output a first digital value corresponding to an analog input voltage in response to a second phase clock signal. A current mode DAC stage is configured to convert the analog input voltage and the first digital value to respective first and second current signals, determine a residue current signal representing a difference between the first and the second current signal, and convert the residue current signal to an analog residual voltage signal. A second ADC stage is coupled to the first ADC stage to receive the analog residual voltage signal, and convert the analog residue voltage signal to a second digital value. An alignment and digital error correction stage is configured to combine the first and the second digital values.

20 Claims, 9 Drawing Sheets

Related U.S. Application Data continuation of application No. 17/120,438, filed on Dec. 14, 2020, now Pat. No. 11,303,292, which is a continuation of application No. 16/359,495, filed on Mar. 20, 2019, now Pat. No. 10,868,557.

(60) Provisional application No. 62/650,536, filed on Mar. 30, 2018.

(51) Int. Cl.
 *H03M 1/14* (2006.01)
 *H03M 1/16* (2006.01)

(58) Field of Classification Search
 USPC .................. 341/143, 144, 153, 161, 162
 See application file for complete search history.

(56) References Cited

U.S. PATENT DOCUMENTS

| | | | |
|---|---|---|---|
| 5,313,206 A | 5/1994 | Davies et al. | |
| 5,389,929 A | 2/1995 | Nayebi et al. | |
| 5,489,904 A | 2/1996 | Hadidi | |
| 5,990,820 A | 11/1999 | Tan | |
| 6,340,943 B1 | 1/2002 | Chow et al. | |
| 6,369,744 B1* | 4/2002 | Chuang | H03M 1/0695 341/161 |
| 6,396,429 B2 | 5/2002 | Singer et al. | |
| 6,489,904 B1 | 12/2002 | Hisano | |
| 7,002,505 B2 | 2/2006 | Hughes | |
| 7,265,703 B2 | 9/2007 | Sasaki et al. | |
| 7,274,321 B2 | 9/2007 | Hurrell et al. | |
| 7,675,451 B2 | 3/2010 | Murayama et al. | |
| 7,688,236 B2 | 3/2010 | Di Giandomenico et al. | |
| 8,274,419 B2 | 9/2012 | Gicquel et al. | |
| 8,754,794 B1 | 6/2014 | Li et al. | |
| 9,048,860 B1 | 6/2015 | Quinn | |
| 9,143,146 B1* | 9/2015 | Pereira | H03M 1/121 |
| 9,362,939 B1 | 6/2016 | Rath et al. | |
| 9,503,119 B2 | 11/2016 | Coulon et al. | |
| 9,595,974 B1 | 3/2017 | Pereira et al. | |
| 9,673,835 B1* | 6/2017 | Kinyua | H03M 1/0607 |
| 9,900,023 B1 | 2/2018 | Kinyua | |
| 10,103,742 B1 | 10/2018 | Guo et al. | |
| 10,171,102 B1* | 1/2019 | Shibata | H03M 3/30 |
| 10,868,557 B2 | 12/2020 | Kinyua et al. | |
| 10,979,066 B1 | 4/2021 | Huang et al. | |
| 11,303,292 B2 | 4/2022 | Kinyua et al. | |
| 11,569,837 B1* | 1/2023 | Akhavan | H03M 1/124 |
| 11,700,009 B2* | 7/2023 | Kinyua | H03M 1/145 341/161 |
| 2003/0154045 A1* | 8/2003 | Sung | H03M 1/165 702/107 |
| 2005/0038846 A1* | 2/2005 | Devendorf | G06G 7/14 708/801 |
| 2005/0062635 A1* | 3/2005 | Franz | H03M 1/1235 341/161 |
| 2010/0176979 A1* | 7/2010 | Hurrell | H03M 1/0626 341/155 |
| 2012/0038498 A1* | 2/2012 | Oshima | G01S 13/931 341/110 |
| 2012/0092199 A1* | 4/2012 | Corsi | H03M 1/069 341/122 |
| 2013/0335250 A1 | 12/2013 | Limotyrakis et al. | |
| 2015/0061767 A1 | 3/2015 | Francis | |
| 2015/0349795 A1* | 12/2015 | Coulon | H03F 3/45565 341/122 |
| 2016/0072518 A1 | 3/2016 | Francis et al. | |
| 2019/0013816 A1* | 1/2019 | Shrivastava | H03M 1/146 |

FOREIGN PATENT DOCUMENTS

| | | |
|---|---|---|
| CN | 102055475 A | 5/2011 |
| CN | 104348489 A | 2/2015 |
| CN | 205320061 U | 6/2016 |

OTHER PUBLICATIONS

Taiwan Office Action for Application No. 108111399 mailed Jun. 11, 2019.

\* cited by examiner

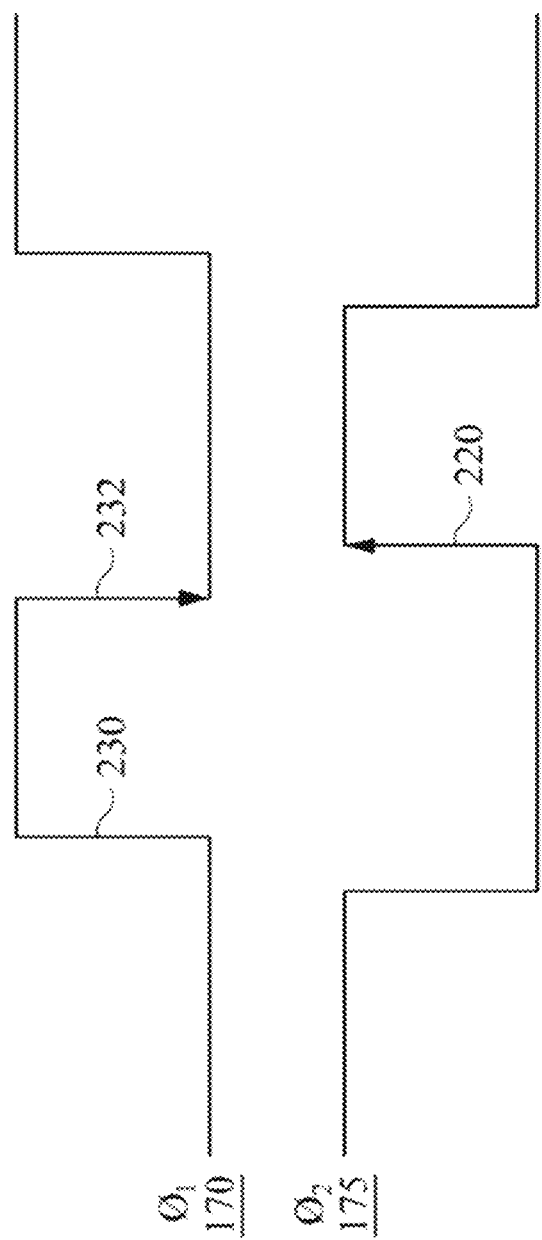

ANALOG TO DIGITAL CONVERTER WITH CURRENT STEERING STAGE

CROSS-REFERENCE TO RELATED APPLICATION

This application is a continuation of application Ser. No. 17/717,519, filed Apr. 11, 2022, which is a continuation of application Ser. No. 17/120,438, filed Dec. 14, 2020, which is a continuation of application Ser. No. 16/359,495, filed Mar. 20, 2019, which issued as U.S. Pat. No. 10,868,557, which application claims the benefit of provisional application Ser. No. 62/650,536, filed Mar. 30, 2018, which applications are incorporated herein by reference in their entirety.

BACKGROUND

Analog-to-digital converters (ADC or A/D) are used in a variety of applications in order to convert a sampled analog signal into a digital signal. There are a variety of ADC architectures, such as pipelined, flash, Sigma-Delta, successive approximation register (SAR), etc. A pipelined, or sub-ranging, ADC uses two or more steps of sub-ranging. A coarse conversion of an analog input voltage to a coarse digital value is done, then the coarse digital value is converted back to an analog signal with a digital-to-analog converter (DAC). The coarse analog value is compared to the input voltage with an analog comparator, and the difference, or residue, is then converted into a finer digital representation and the results are combined.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a phase diagram illustrating the ADC clock signals in accordance with some embodiments.

DETAILED DESCRIPTION

Figure 1A:
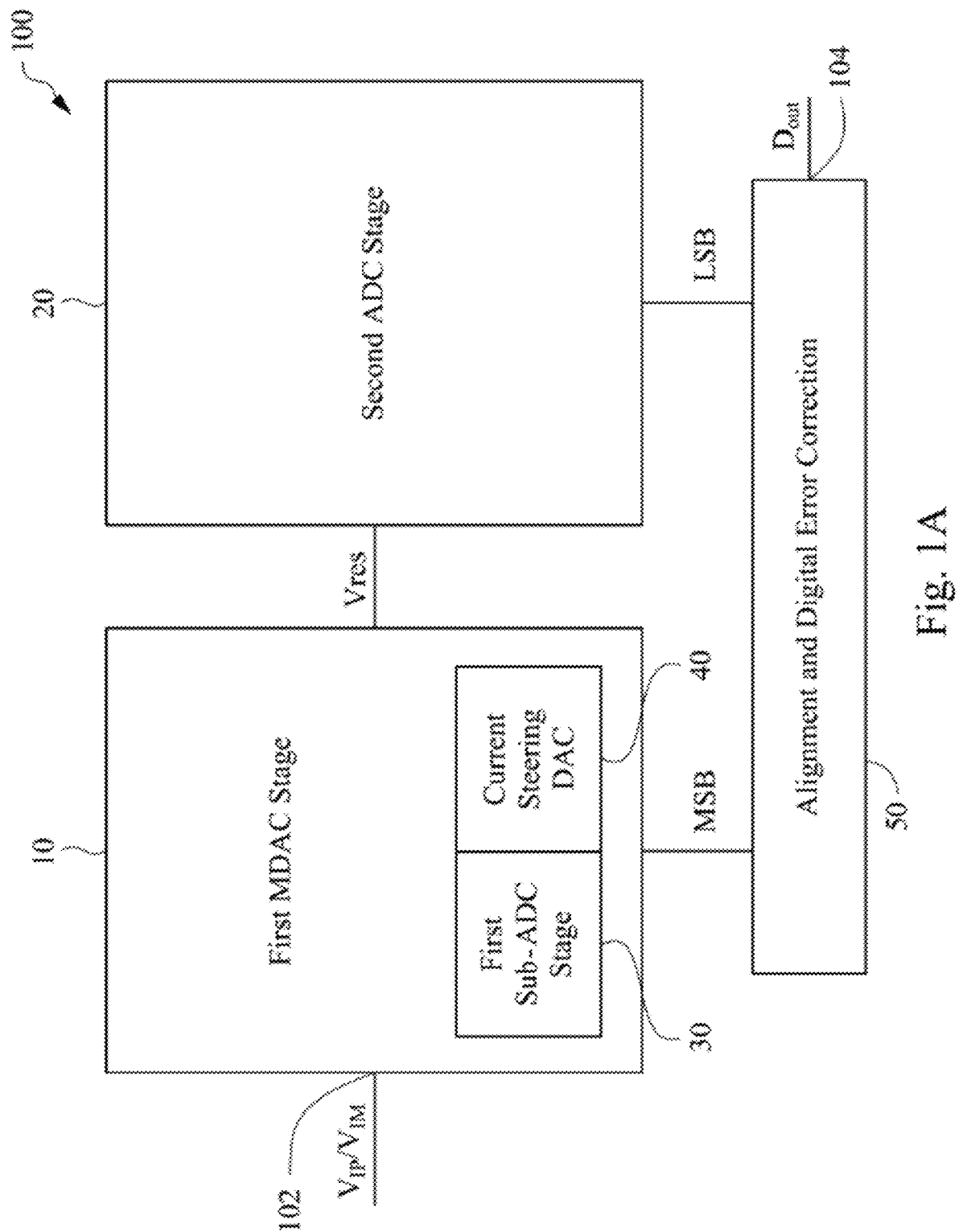
FIG. 1A is a block diagram illustrating aspects of an analog-to-digital converter (ADC) system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Analog-to-digital converters (ADC) convert an analog voltage signal into a digital signal. For example, a pipelined, or sub-ranging, ADC uses two or more steps of sub-ranging. A coarse conversion of an analog input voltage to a coarse digital value is done, then the coarse digital value is converted back to an analog signal with a digital-to-analog converter (DAC). The coarse value is compared to the input voltage with an analog comparator, and the difference, or residue, is then converted finer and the results are combined.

A successive-approximation ADC uses a comparator to successively narrow a range that contains the input voltage. At each successive step, the converter compares the input voltage to the output of a DAC that might represent the midpoint of a selected voltage range. At each step in this process, the approximation is stored in a successive approximation register (SAR). The steps are continued until the desired resolution is reached. With some ADC methods, it can be difficult to attain a sufficiently high signal to noise ratio (SNR) and conversion bandwidth in low voltage deep submicron processes.

Some pipelined ADC methods use a switched capacitor Multiplying DAC (MDAC) which tends to be limited in conversion bandwidth. While pipelined ADCs can provide high resolution and high bandwidth conversion, they also tend to be power hungry because they use several switched capacitor MDACs. Similarly, while SAR ADCs provide a relatively low power architecture, they also use a traditional switched capacitor MDAC. Such ADC methods may not be readily scalable to deep sub-micron process technologies while attaining good power efficiency.

The present disclosure includes examples of a multi-stage pipelined ADC with a current steering first stage and a cascaded SAR second stage. As discussed in further detail below, disclosed examples employ both current domain and voltage domain signal processing to attain high sampling rates and low power consumption. In some disclosed examples, this is achieved by the use of a low power current steering DAC approach, where a combined current steering DAC and a transconductance amplifier cell are employed. A high conversion rate is achievable because the proposed current steering DAC is inherently faster than a switched capacitor method for the same power consumption by essentially replacing the switched capacitor network of a conventional switched capacitor MDAC with feedback resistors to convert the residue current signals to a voltage signal.

FIG. 1A generally illustrates an example of an ADC system 100 in accordance with some disclosed embodiments. In general, the ADC system 100 includes a first MDAC stage 10 coupled to an input terminal 102 that receives an analog input voltage signal $V_{IP}/V_{IM}$. The first MDAC stage 10 includes a first sub-ADC stage 30 configured to output a first digital value corresponding to the analog input voltage. In some examples, the first digital value output by the first MDAC stage 10 is the most significant bits (MSB) of the ADC digital output signal. The first MDAC stage 10 further includes a current steering DAC stage 40 that is connected to the input terminal 102 and receives the output of the first sub-ADC stage 30. The current steering DAC stage 40 converts the analog input voltage and the first digital value to respective first and second current signals, determines a residue current signal representing a difference between the first current signal and the second current signal in the current domain, and converts the residue current signal to an analog residual voltage output signal Vres.

A second ADC stage 20 is coupled to the first MDAC stage 10 to receive the analog residual voltage signal Vres, and convert the analog residue voltage signal Vres to a second digital value, which in the illustrated example is the least significant bits (LSB) of the ADC digital output signal. An alignment and digital error correction stage 50 is configured to combine the first and the second digital values MSB, LSB and output a digital value $D_{out}$ representing the analog input signals at an output terminal 104.

Figure 1B:
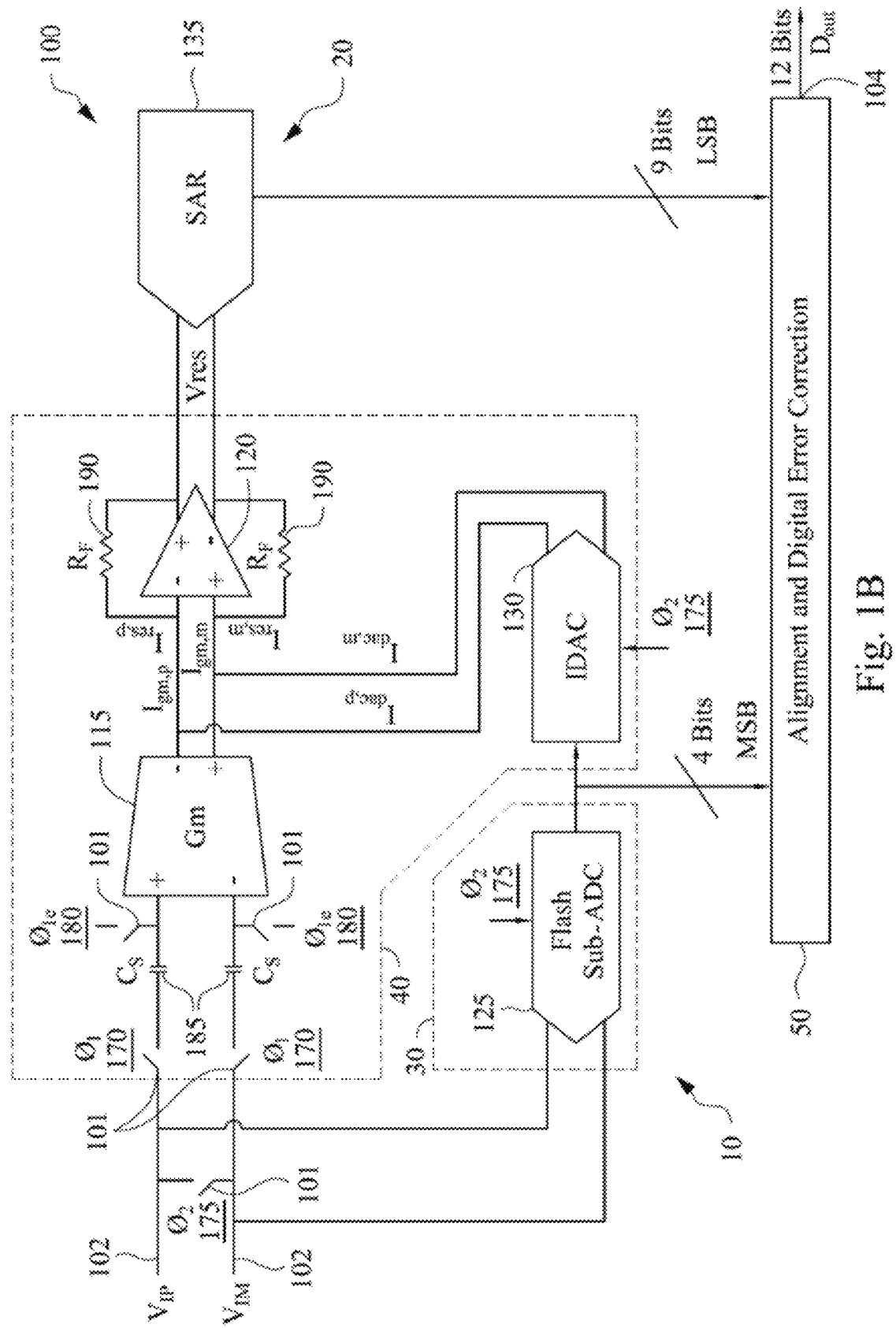
FIG. 1B is a circuit diagram illustrating further aspects of an analog-to-digital converter (ADC) in accordance with some embodiments.

FIG. 1B depicts further aspects of the ADC system 100 shown in FIG. 1A. In FIG. 1B, the first sub ADC stage 30 of the first MDAC stage 10 includes a flash sub-ADC 125, while the second ADC stage 20 includes a cascaded successive approximation register (SAR) 135 ADC.

The input terminal 102 is configured to receive differential analog input signals $V_{IP}$ and $V_{IM}$, which are sampled by a switched capacitor network 185. As discussed further below, various control signals (170, 175, 180) are provided to control the operation of a plurality of switches 101 as well as the flash ADC 125 and the current steering digital-to-analog converter (IDAC) 130.

The illustrated first sub-ADC stage 30 includes a flash sub-ADC 125 to generate the first digital value MSB of the digital output signal $V_{out}$. The flash sub-ADC 125 receives the differential analog input signals $V_{IP}$, $V_{IM}$ and converts this analog signal to the first digital value at an output terminal that is connected to the alignment and digital error correction stage 50 and the current steering DAC stage 40. The current steering DAC stage 40 is comprised of a transconductance amplifier (Gm) 115 to perform a voltage-to-current conversion of the sampled input signal. In the illustrated example, the Gm 115 does not receive a current feedback signal and thus operates open loop. Examples of the current steering DAC stage 40 also have a current steering IDAC 130 configured to receive and convert the first digital value received from the flash sub-ADC 125 back to an analog representation in the current domain. The Gm 115 and IDAC 130 output currents are combined to generate a residue current representing the difference between the first digital value and the input voltage, which is then converted to the voltage residue signal Vres and output to the second ADC stage 20. As discussed further below, in some examples, the operations of the Gm cell 115 and the IDAC 130 are merged or combined into a common circuit, thus simplifying the actual circuit implementation. Additionally, the Gain-Bandwidth requirements of the residue amplifier may be significantly reduced since the Gain-Bandwidth is inversely proportional to the residue amplifier feedback factor and the disclosed amplifier has a feedback factor close to unity. This in turn reduces the power consumption of the circuit compared to conventional switched capacitor MDAC methods.

The residue amplifier 120 is configured to receive the residue current Ires,p/Ires,m from the Gm 115 and IDAC 130, and convert the residue current Ires,p/Ires,m into the residue voltage signal Vres based on the feedback resistors 190. The residue voltage Vres represents the difference between the analog input voltage and the first digital representation of the analog input voltage signal output by the Flash sub-ADC 125. As discussed further herein below, the residue amplifier may include two stages, the first stage employing a wideband self-biased amplifier and the second stage having a common mode feedback circuit. The residue voltage is then passed to the second ADC stage 20 of the ADC system 100. Employing a current mode processing of the residue, rather than a switched-capacitor device reduces influences of capacitor loading on the residue amplifier to improve performance.

In the illustrated example, the second ADC stage 20 is coupled to receive the residue voltage output by the current steering DAC stage 40. Additionally, second ADC stage 20 is configured to convert the residue voltage into the second digital value representing the least significant bits (LSBs) of the digital output signal. The MSBs and LSBs are received and combined in the alignment and digital error correction stage 50, which outputs the digital representation $D_{out}$ of the analog input voltage at the output terminal 104. In the illustrated example, the first ADC stage 10 provides 4 bit MSBs, and the second ADC stage 20 provides 9 bit LSBs to the alignment and digital error correction stage 50, which provides a 12 bit digital output signal (one bit is redundant and is used to accomplish the digital error correction function).

Using current steering instead of switch capacitors in the first MDAC stage 10 reduces the gain-bandwidth (GBW) requirements of the amplifier for a given settling accuracy. Referring to Equations 1 and 2 shown below, generally, the gain bandwidth is required to be greater than or equal to two times the sampling frequency ($F_S$) times the natural log of two times the number of bits converted after the first MDAC stage 10, or "backend bits" ($N_{BACKEND}$) all over the feedback factor (β) (see Equation 1). In Equations 1 and 2, β is defined as $R_{GM}$ (or $R_{DAC}$) divided by $R_{GM}$ (or $R_{DAC}$) plus $R_F$, see Equation 2. The feedback factor β is close to unity in the current steering DAC since the resistance of $R_F$ 190 is small compared to the resistance of the IDAC 130 and GM 115. A switched capacitor MDAC has a β much less than unity, which indicates a larger GBW is required for the same settling accuracy vis-à-vis the current steering approach.

$$GBW \geq \frac{2 * F_s * \text{Ln}(2) * N_{backend}}{\beta} \quad (1)$$

$$\beta = \frac{R_{GM} \| R_{DAC}}{R_{GM} \| R_{DAC} + R_F} \approx 1 \quad (2)$$

Thus, the Gain-Bandwidth requirements of the disclosed residue amplifier are significantly reduced, since the Gain-Bandwidth is inversely proportional to the feedback factor, β, and the example residue amplifier arrangement has a feedback factor close to unity. As an example, GBW requirements for a 12 bit/500 MSPS ADC using current steering would be less than 10 GHz, while an ADC of the same specifications using switched capacitors instead of current steering would have a GBW requirement of greater than 100 GHz.

FIG. 2 depicts an example of the control signals 170, 175 for the switches 101, the Gm 115, the flash ADC 125, the IDAC 130, the residue amplifier 120, and the SAR 135. The switches 101 turn on when the first phase control signal 170 goes high at a time 230, resulting in the sampling capacitors 185 charging based on the analog input signals $V_{IP}$, $V_{IM}$. When the first phase signal 170 goes low at time 232, the switches 170 open and the Gm 115 and the flash ADC 125 sample the analog input signals $V_{IP}$, $V_{IM}$. The flash ADC 125 and the IDAC 130 complete the respective conversions and latches the output based on the second phase control signal 175 going high at a time 220. Additionally, when the first phase control signal 170 is high, the residue current signals from the Gm 115 and IDAC 130 are not output to the residue amplifier 120 while the input signals $V_{IP}$, $V_{IM}$ are sampled, allowing the residue amplifier 120 to be reset.

Figure 3:
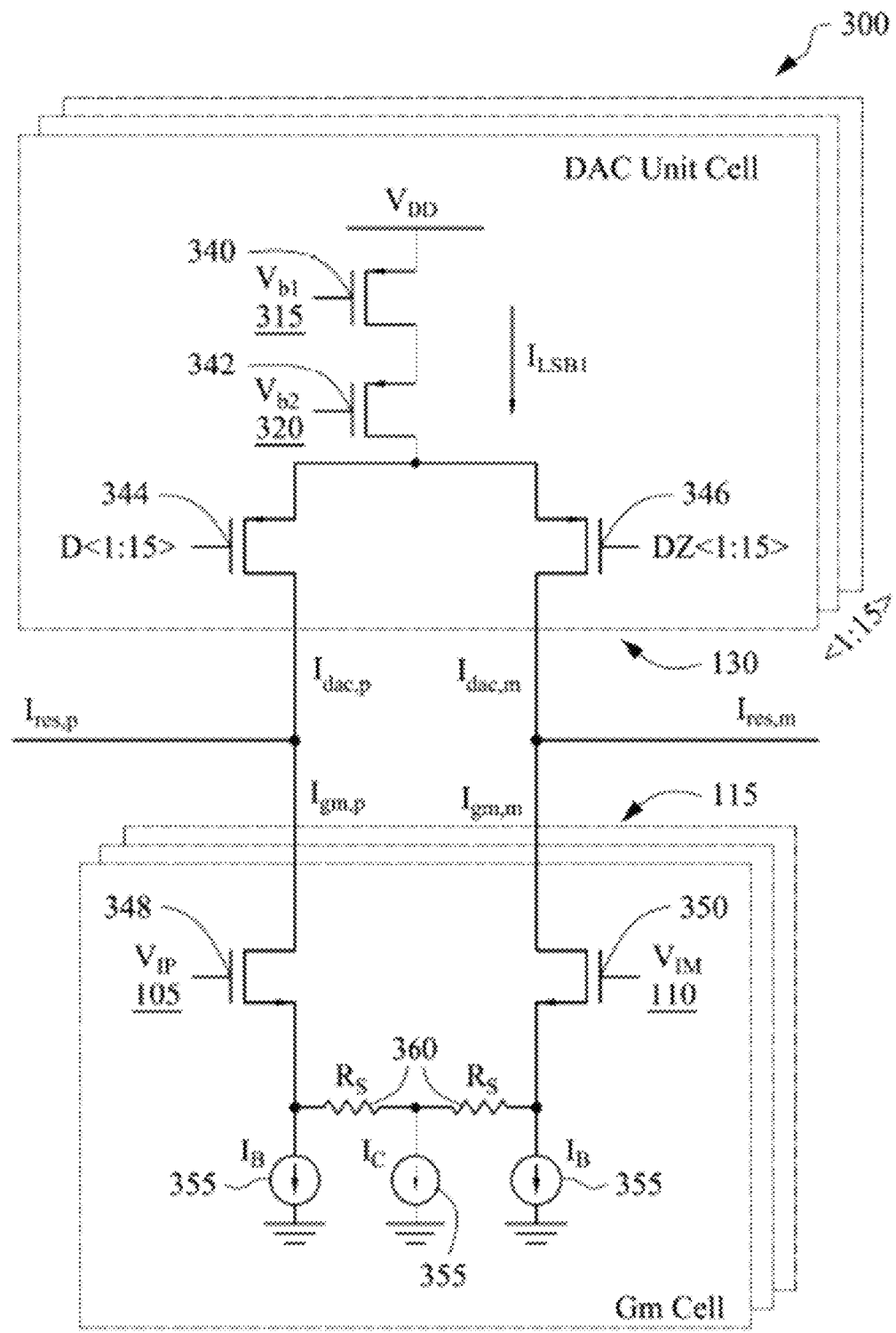
FIG. 3 is a circuit diagram illustrating aspects of a current steering digital-to-analog conversion (DAC) and transconductance (Gm) stage of an ADC in accordance with some embodiments.

FIG. 3 is a circuit diagram 300 illustrating aspects of an example of the IDAC 130 and transconductance amplifier (Gm) 115 of the ADC 100. In some examples, the IDAC 130 is comprised of a plurality of DAC unit cells 130, and the Gm 115 may also include a plurality of Gm cells 115.

Each of the IDAC 130 cells includes transistors 340 and 342. The transistor 340 is controlled by bias voltage $V_{b1}$ and is connected between a voltage terminal $V_{DD}$ and the transistor 342, which receives a bias voltage $V_{b2}$ at its gate terminal. The transistors 340 and 342 are configured to provide a current source representing the least significant digits $I_{LSb1}$ to transistors 344 and 346 based on the MSB digital output signal. Control signals D and DZ are received at respective gate terminals to control the operation of the transistors 344 and 346 to output the residual current signals $I_{res,p}$, $I_{res,m}$ representing the analog residual voltage signal. The control signals D and DZ are provided by the first stage flash ADC 125 outputs.

The Gm cell 115 converts the analog input voltage signals $V_{IP}$ and $V_{IM}$ from the voltage domain into a representation of the voltage in the current domain. The GM cell 115 includes current sources 355 and resistors $R_S$ 360. The transistors 348, 350 are connected to the current sources 355, with the analog input voltage signals $V_{IP}$ and $V_{IM}$ coupled to the respective gate terminals of the transistors 348, 350. The Gm cell 115 thus provides current signals Igm,p/Igm,m representing the sampled analog input voltage signals $V_{IP}$ and $V_{IM}$. As noted above, the IDAC unit cell 130 outputs a current signal Idac,p/Idac,m representing the analog input signals. The IDAC 130 and Gm 115 output the residue current signals Ires,p/Ires,m, which represents the difference between the current signals Igm,p/Igm,m output by the Gm unit cell 115 and the current signals Idac,p/Idac,m output by the IDAC cells 130. The residue current signal Idac,p/Idac,m is received by the residue amplifier 120, which outputs the voltage residue signals that represents the difference between the sample input voltage and the first digital signal output by the sub ADC 125.

Thus, the operations of the Gm 115 and the IDAC 130 may be merged into a common circuit as shown in FIG. 3, which may simplify the circuit implementation. More particularly, in some disclosed examples the incoming voltage signals are converted into current, a voltage-to-current converter (Gm cell 115) may be used to perform the transformation between the voltage and current domains. The Gm cell 115 yields a current given by the Equation 3 shown below.

$$I_{resp} - I_{resm} = 1I_{LSB} - \frac{(V_{IP} - V_{IM})}{2R_S} - (2I_B + I_C) \qquad (3)$$

As seen from Equation 3, the output current ($I_{res,p}-I_{res,m}$) of the combined circuit yields a current containing the IDAC 130 current ($1I_{LSB}$), the Gm 115 current ($V_{IP}-V_{IM}$ divided by $2R_S$) and bias currents ($2I_B+I_C$), and therefore represents a "merged" current comprising the Gm and DAC currents.

Figure 4A:
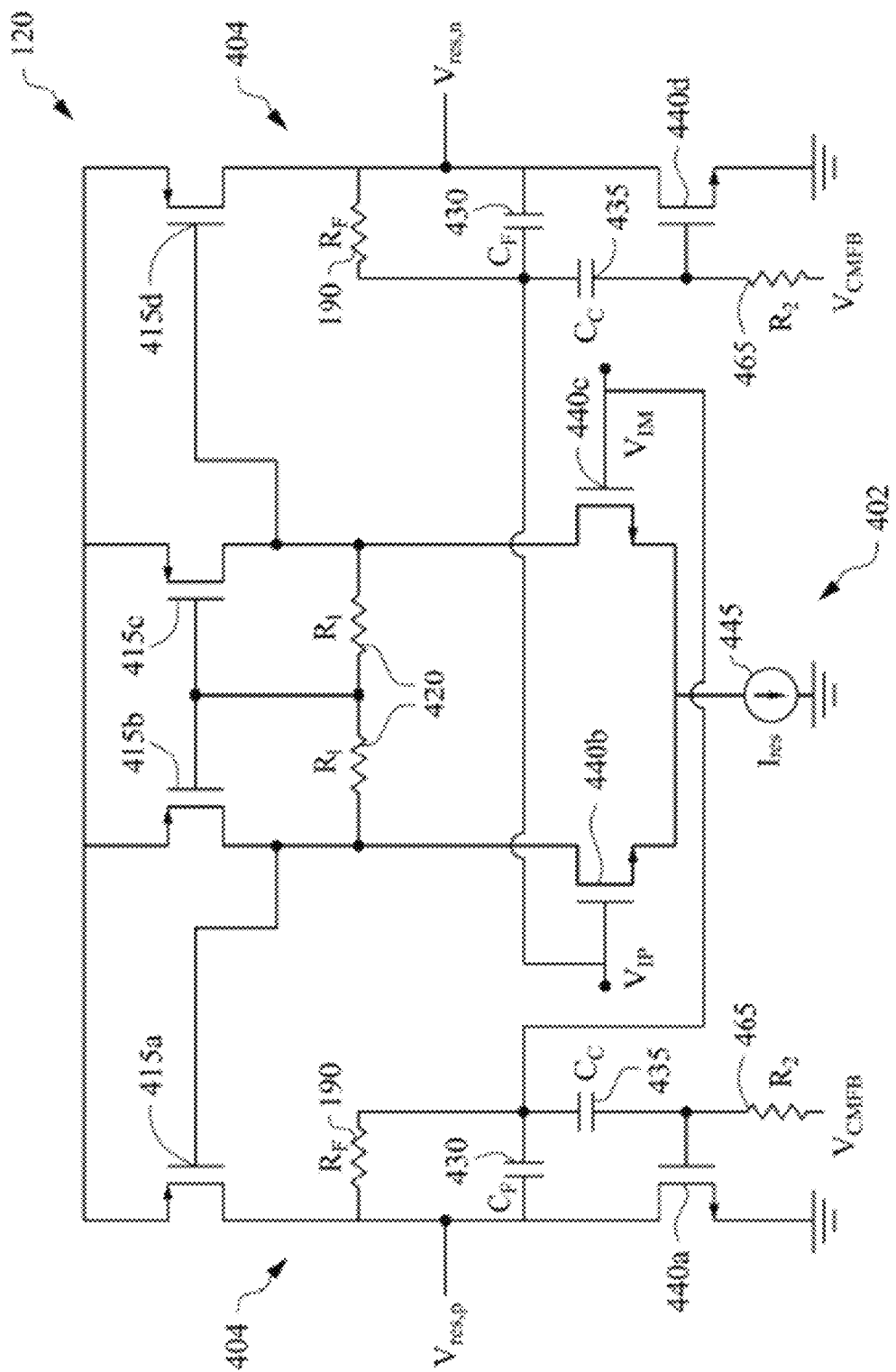
FIGS. 4A and B are circuit diagrams depicting aspects of a residue amplifier of an ADC in accordance with some embodiments.
Figure 4B:
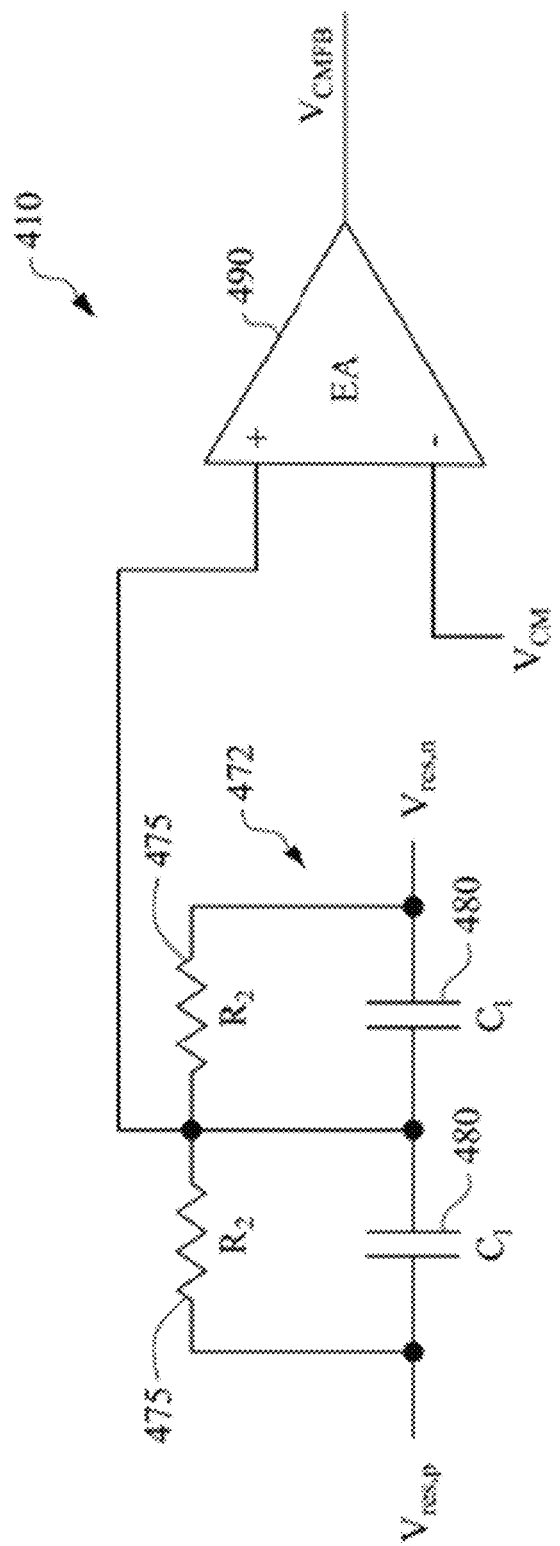

FIGS. 4A and 4B illustrate aspects of an example of the residue amplifier 120, which may be a transimpedance amplifier configured to convert the residue current signal to an analog voltage signal output to the second ADC stage 20. In some examples, the residue amplifier 120 is a two-stage residue amplifier with feed forward compensation.

The residue amplifier 120 illustrated in FIG. 4A may be a fully differential amplifier that comprises a first stage 402 and a second stage 404. The first stage 402 contains input pair transistors 440b and 440c having gate terminals coupled to the differential input voltage signals $V_{IP}/V_{IM}$, with a load that may include a resistor pair 420, and transistors 415b and 415c. The bias current is set by a current source 445 including the residue current Ires output by the combined Gm 115 and IDAC 130. The differential outputs Vres,p/Vres,m of the first stage 402 represent the residue signal output by the first MDAC stage 10, and are coupled to the inputs of the second stage 404 via transistors 415d and 415a. The second stage 404 includes transistors 440d, 415d, 440a and 415a. The resistors 190 feedback the residue voltage signals Vres,p and Vres,m from the second stage 404 output back to the first stage inputs $V_{IM}$ and $V_{IP}$. The amplifier is compensated by capacitors 435 and 430.

The resultant currents provided by the Gm 115 and IDAC 130 are amplified and converted back into the voltage domain for later use by the SAR 135 to produce the LSBs of the digital output signal Dout. The differential input voltages $V_{IM}$ and $V_{IP}$, are coupled to the current signals Igm and Idac via the transistors 350 and 348 as shown in FIG. 3. In addition, the residue voltage signals Vres,p/Vres,m output by the amplifier are connected to the input voltages $V_{IM}$ and $V_{IP}$ in a negative feedback configuration through the feedback resistors 190.

FIG. 4B shows an example of a common-mode feedback circuit 410 that provides a common mode feedback voltage signal $V_{CMFB}$ to the amplifier 120 shown in FIG. 4A. The residue voltage signals Vres,p/Vres,m output by the amplifier 400 are sampled by a common mode detector circuit 472. The common mode detector 472 is comprised of capacitors 480 and resistors 475. The common mode detector 472 takes an average of the residue voltage signals Vres,p, Vres,m and that average is sent to the positive terminal of an error amplifier 490. The error amplifier 490 compares the averaged voltage to the common mode voltage $V_{CM}$ and outputs the common mode feedback voltage $V_{CMFB}$ to the first stage of the residue amplifier 400 via the resistors 465.

Figure 5:
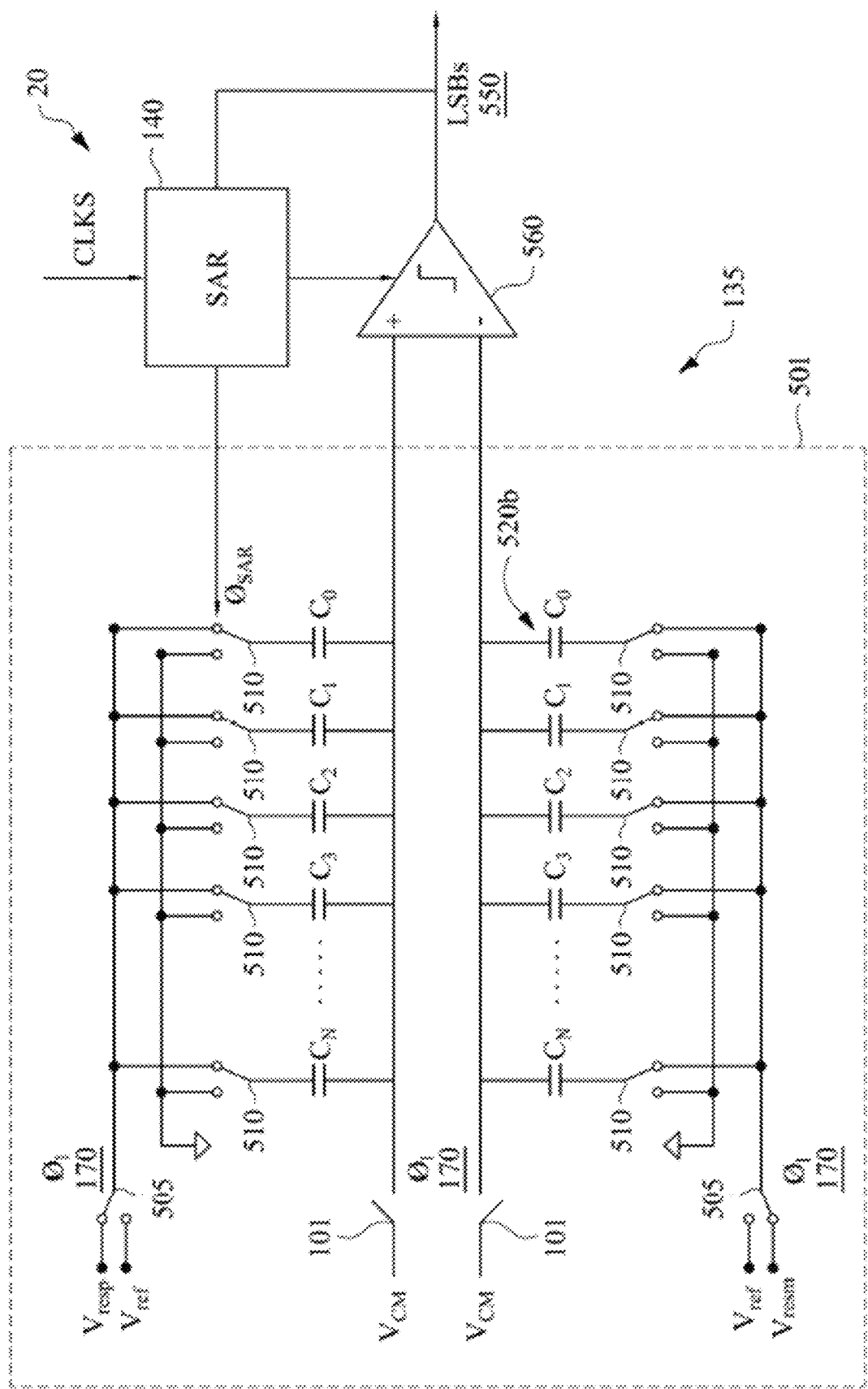
FIG. 5 is a circuit diagram illustrating aspects of a successive approximation register (SAR) stage of an ADC in accordance with some embodiments.

FIG. 5 depicts an example of the second ADC stage 20, which includes a SAR ADC 135 in some examples. The SAR ADC 135 includes a sample and hold circuit 501, a comparator 560 and SAR logic 140. The SAR logic 140 receives a clock signal CLKS and provides an output signal $\phi_{SAR}$ to the sample and hold circuit 501. The output signal ϕ$_{SAR}$ controls the operation of a plurality of switches 510 to selectively connect one side of a plurality of capacitors. In the illustrated example, there are two sets of capacitors 520a, 520b corresponding respectively to the differential residue voltage inputs Vres,p and Vres,m. Each of the sets of capacitors 520a, 520b includes a plurality of capacitors $C_0$-$C_N$, where N may correspond to the number of bits to be converted, such as the LSB bits shown in FIG. 1B. In some examples, the capacitors are binary weighted, with the minimum capacitor size C being about 2 fF in some embodiments. The control signal 170 controls various SPDT switches 505 used to connect the sample and hold circuit 501 to the input residue voltages Vres,p and Vres,m, and to a reference signal $V_{ref}$ as well as switches 101 connecting the common mode voltage signal $V_{CM}$ to the sample and hold circuit 501 and the comparator 560.

Referring to FIG. 2, when the control signal ϕ$_1$ 170 is high, switches 505 connect the analog residue input signals Vres,p and Vres,m to the top plates of the capacitors $C_0$-$C_N$ of the sets of capacitors 520a, 520b. At the same time, the bottom plates of the capacitors $C_0$-$C_N$ and the inputs of the comparator 560 are coupled to the common mode voltage $V_{CM}$ due to switches 101 closing. During the next phase the output signal ϕ$_{SAR}$ pulses are asserted to control the binary search algorithm implemented by the SAR logic 135 to generate the second digital output representing the LSBs of the analog input voltage.

Figure 6:
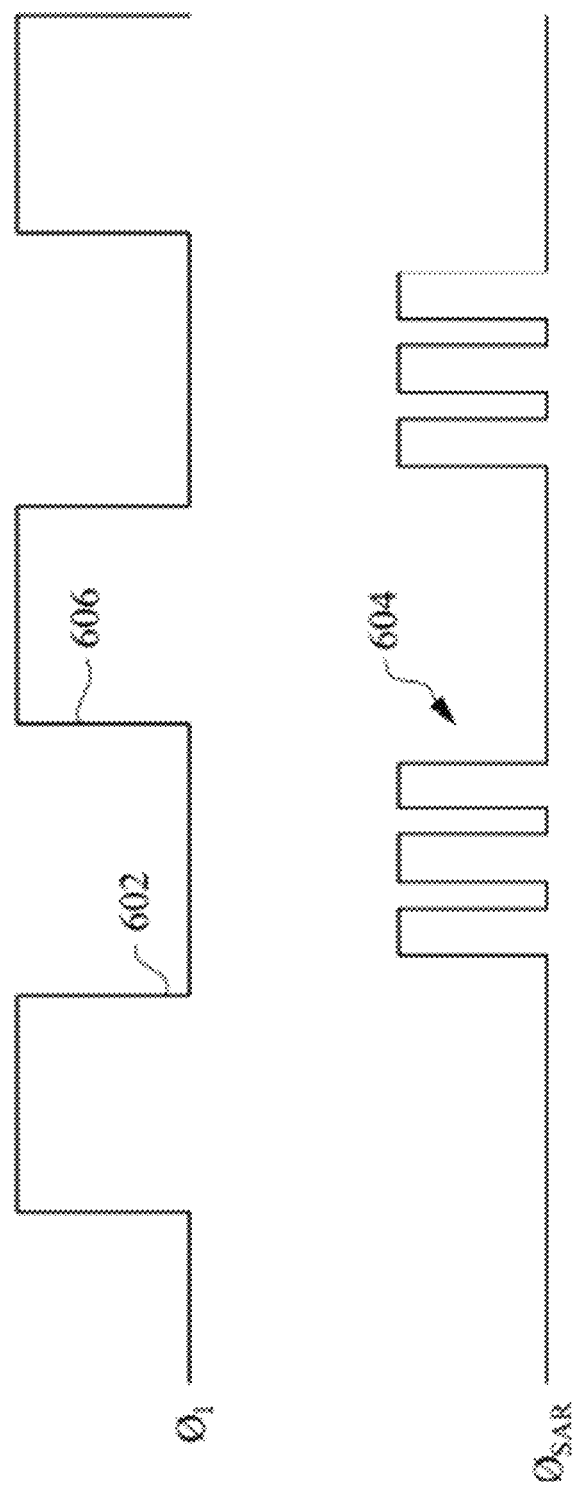
FIG. 6 is a phase diagram illustrating the SAR clock signals in accordance with some embodiments.

FIG. 6 illustrates an example phase diagram for the control signal ϕ$_1$ 170 and the output signal ϕ$_{SAR}$. The control signal ϕ$_1$ 170 is used for tracking and holding the signal in the SAR ADC 135 of the second ADC stage 20 of the ADC 100 while the output signal ϕ$_{SAR}$ is used to control the operation of the switches 510 shown in FIG. 5. When the input control signal ϕ$_1$ 170 goes low as shown at a time 602, the output signal ϕ$_{SAR}$ starts cycling and provides a plurality of output pulses 604 to control the switches 510 and sample the differential input signals $V_{IP}$ and $V_{IM}$ via the sets of capacitors 520a, 520b. When the control signal ϕ$_1$ 170 goes high such as at the time 606, the output signal ϕ$_{SAR}$ stops cycling and the output pulses 604 cease.

Figure 7:
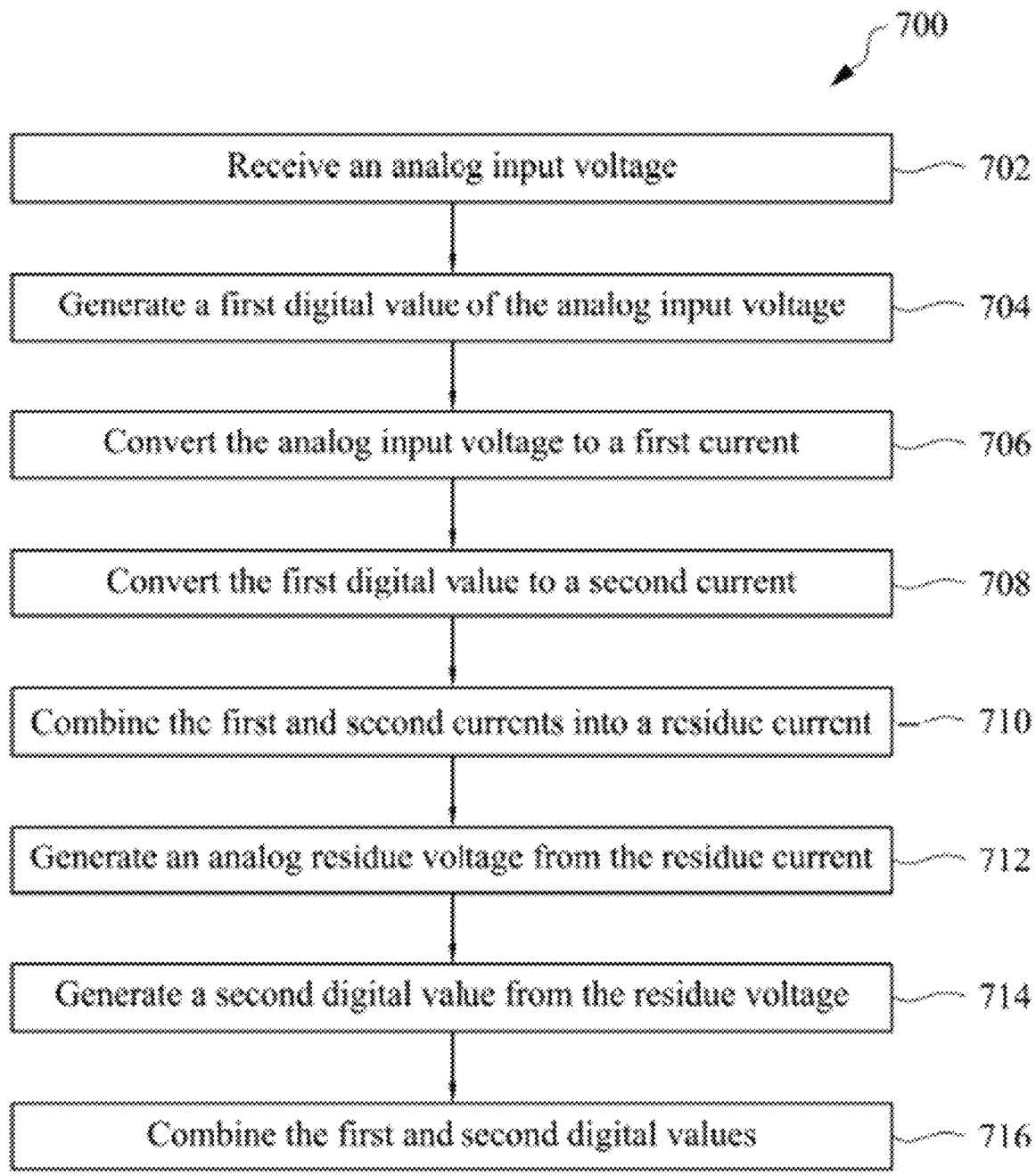
FIG. 7 depicts an analog-to-digital conversion method in accordance with some embodiments.

FIG. 7 shows an example of an ADC method 700 implemented by the ADC 100. The method 700 starts at block 702 where an analog input voltage $V_{IP}$, $V_{IM}$ is received, for example, at the input terminals 102 shown in FIG. 1B. At block 704 the analog input voltage is converted to a first digital value, which may be the MSBs for the digital output signal, and at block 706 the analog input voltage is converted into a first current $I_{gm,p}$, $I_{gm,m}$. At block 708 the first digital value is converted to a second current $I_{dac,p}$, $I_{dac,m}$. The first and second current signals are combined into a residue current signal $I_{res,p}$, $I_{res,m}$ in block 710. At block 712, and analog residue voltage is generated from the residue current. This residue voltage is then used in the generation of a second digital value in block 714, which may be the LSBs of the digital output signal. In block 716 the first digital value and the second digital value are combined to create the digital output signal representing the analog input signal.

Accordingly, the various embodiments disclosed herein provide an ADC method and system that can achieve a high conversion rate and high accuracy with good power efficiency. Disclosed embodiments include a first ADC stage with a first sub-ADC stage configured to output a first digital value corresponding to an analog input voltage. A current steering DAC stage is configured to convert the analog input voltage and the first digital value to respective first and second current signals, determine a residue current signal representing a difference between the first current signal and the second current signal in the current domain, and convert the residue current signal to an analog residual voltage signal. A second ADC stage is coupled to the first ADC stage to receive the analog residual voltage signal, and convert the analog residue voltage signal to a second digital value. An alignment and digital error correction stage is configured to combine the first and the second digital values into a digital output voltage.

In accordance with additional embodiments, an ADC conversion method includes receiving an analog input voltage signal, converting the analog input voltage signal to a first digital signal, and converting the analog input voltage to a first current signal. The first digital value is converted to a second current signal, and the first and second currents are combined into a residue current signal. The residue current signal is converted to an analog residue voltage signal, and the analog residue voltage signal is converted to a second digital signal. The first and second digital signals are combined into a digital output signal representing the analog input voltage signal.

In accordance with still further examples, an ADC has an input terminal configured to receive an analog input voltage. A sub ADC is configured to sample the received analog input voltage signal and output a first digital signal representing the analog input voltage signal. A transconductance amplifier is configured to sample the received analog input voltage signal and output a first current signal. A DAC converter is configured to receive the first digital signal and output a second current signal representing the first digital signal, and a residual amplifier is configured to receive the first and second current signals and output an analog residual voltage signal based on the first and second current signals. A residue ADC is configured to receive the analog residue voltage signal and output a second digital signal representing the analog residue voltage signal. An alignment and error correction circuit is configured to combine the first and second digital signals.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An analog-to-digital converter (ADC), comprising:
an input terminal configured to receive an analog input voltage;
a current mode digital-to-analog converter (DAC) stage including
a transconductance amplifier (Gm) connected to the input terminal, the transconductance amplifier having a first plurality of transconductance amplifier cells, the transconductance amplifier configured to sample the analog input voltage in response to a first phase clock signal and convert the analog input voltage to a first current signal,
a current mode DAC having a second plurality of current mode DAC unit cells and configured to convert a first digital value corresponding to the analog input voltage to a second current signal, the current mode DAC stage configured to determine a residue current signal representing a difference between the first current signal and the second current signal, and convert the residue current signal to an analog residual voltage signal;

a residue amplifier configured to convert the residue current signal to analog residue voltage signal, the residue amplifier including first and second stages, the first stage having a wideband self-biased amplifier and the second stage including a common mode feedback circuit;

an alignment and digital error correction stage configured to combine the first digital value and a second digital value representing the analog residue voltage signal into a digital output voltage; and an output terminal coupled to the alignment and error correction stage configured to output the digital output voltage.

2. The ADC of claim 1, wherein the current mode DAC is configured to convert the first digital value to the second current signal in response to the second phase clock signal.

3. The ADC of claim 1, further comprising a flash ADC coupled to the input terminal configured to convert the analog input voltage to the first digital value.

4. The ADC of claim 1, wherein the current mode DAC stage is configured to combine the first current signal and the second current signal to generate the residue current signal in the current domain.

5. The ADC of claim 1, wherein the second ADC stage includes a successive approximation register ("SAR") ADC.

6. The ADC of claim 1, wherein the transconductance amplifier and the current mode DAC form an output node at a junction of the transconductance amplifier and the current mode DAC;

wherein each current mode DAC unit cell includes a voltage terminal, a first transistor, a second transistor, a first pair of differential transistors including a third transistor and a fourth transistor, the first transistor connected between the voltage terminal and the second transistor, the second transistor connected between the first transistor and the first pair of differential transistors, gates of the first transistor and the second transistor receive bias voltages to provide a current source, and gates of the third transistor and the fourth transistor receive control signals to output the second current signal at the output node; and wherein each transconductance amplifier cell includes a third plurality of current sources, a fourth plurality of resistors, a second pair of differential transistors including a fifth transistor and a sixth transistor, and gates of the fifth transistor and the sixth transistor receive the analog input voltage to output the first current signal at the output node.

7. An analog-to-digital converter (ADC), comprising:
an input terminal configured to receive an analog input voltage;

a transconductance amplifier configured to sample the received analog input voltage signal and output a first current signal;

a current mode digital to analog converter (DAC) configured to receive a first digital signal corresponding to the analog input voltage and output a second current signal representing the first digital signal, the current mode DAC having a plurality of current mode DAC unit cells;

a residual amplifier configured to receive the first and second current signals and output an analog residual voltage signal based on a difference between the first and second current signals;

a residue ADC configured to receive the analog residue voltage signal and output a second digital signal representing the analog residue voltage signal; and an alignment and error correction circuit configured to combine the first and second digital signals;

wherein the residual amplifier further comprises a common mode feedback circuit includes:

a common mode detector circuit having an input terminal coupled to a residual output terminal of the residual amplifier output stage, the common mode detector circuit configured to output an average of analog residual voltage signal at a common mode output terminal; and an error amplifier having a first input coupled to the common mode output terminal of the common mode detector circuit and a second input configured to receive a common mode voltage signal, the error amplifier configured to output a common mode feedback signal to the output stage of the residual amplifier.

8. The ADC of claim 7, wherein the current mode DAC is configured to output the second current signal in response to a second phase clock signal.

9. The ADC of claim 7, wherein the residual amplifier is configured to reset in response to a first phase clock signal.

10. The ADC of claim 7, further comprising a flash ADC connected to the input terminal to receive the analog input voltage.

11. The ADC of claim 7, wherein the residual amplifier is configured to amplify the difference between the first and second current signals.

12. The ADC of claim 7, wherein the residue ADC comprises a successive approximation register ("SAR") ADC.

13. An analog-to-digital conversion (ADC) method, comprising:

receiving an analog input voltage signal;

sampling the received analog input voltage signal in response to a first phase clock signal;

generating a first digital signal representing the analog input voltage signal in response to a second phase clock signal subsequent to the first phase clock signal;

sampling the received analog input voltage signal in response to the first phase clock signal by a transconductance amplifier;

generating a first current signal by the transconductance amplifier;

generating a second current signal representing the first digital signal by a current mode digital-to-analog converter (DAC);

generating a residue current signal based on a difference between the first and second current signals by the current mode DAC stage;

converting the residue current signal to an analog residual voltage signal by a residue amplifier including first and second stages, the first stage having a wideband self-biased amplifier and the second stage including a common mode feedback circuit;

generating a second digital signal representing the analog residue voltage signal; and combining the first and second digital signals into a digital output signal representing the analog input voltage signal.

14. The analog-to-digital conversion method of claim 13, wherein the received analog input voltage signal is sampled by a flash ADC.

15. The analog-to-digital conversion method of claim 13, wherein the difference between the first and second current signals is determined at a summing junction.

16. The analog-to-digital conversion method of claim 13, wherein the current mode DAC includes a plurality of current mode DAC unit cells.

17. The ADC of claim 7, wherein the transconductance amplifier includes a first plurality of transconductance amplifier cells.

18. The ADC of claim 17, wherein the transconductance amplifier is configured to sample the analog input voltage in response to a first phase clock signal.

19. The ADC of claim 18, wherein the transconductance amplifier and the current mode DAC form an output node at a junction of the transconductance amplifier and the current mode DAC.

20. The method of claim 13, wherein the received analog input voltage signal is sampled by a transconductance amplifier.

* * * * *